United States Patent
Rao et al.

(10) Patent No.: US 9,210,486 B2
(45) Date of Patent: Dec. 8, 2015

(54) SWITCHING FABRIC FOR EMBEDDED RECONFIGURABLE COMPUTING

(71) Applicant: QUALCOMM Incorporated, San Diego, CA (US)

(72) Inventors: Hari Rao, San Diego, CA (US); Ioannis Nousias, San Diego, CA (US); Sami Khawam, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 303 days.

(21) Appl. No.: 13/781,755

(22) Filed: Mar. 1, 2013

(65) Prior Publication Data

US 2014/0247825 A1    Sep. 4, 2014

(51) Int. Cl.
*H04Q 11/00* (2006.01)
*H03K 19/173* (2006.01)

(52) U.S. Cl.
CPC ........... *H04Q 11/00* (2013.01); *H03K 19/1737* (2013.01)

(58) Field of Classification Search
None
See application file for complete search history.

(56) References Cited

U.S. PATENT DOCUMENTS

| 6,467,009 | B1 | 10/2002 | Winegarden et al. |
| 7,071,732 | B1 | 7/2006 | Jang et al. |
| 7,755,388 | B2 | 7/2010 | Deshmukh et al. |
| 8,076,955 | B2 | 12/2011 | Danilin et al. |
| 8,131,909 | B1 * | 3/2012 | Verma et al. ................... 710/316 |
| 2002/0141396 | A1 * | 10/2002 | Pittman ........................ 370/359 |
| 2004/0225704 | A1 * | 11/2004 | Cambonie .................... 708/523 |
| 2006/0087342 | A1 * | 4/2006 | Ayodhyawasi et al. ......... 326/41 |
| 2010/0097098 | A1 * | 4/2010 | Danilin et al. ................. 326/38 |
| 2010/0122105 | A1 * | 5/2010 | Arslan et al. .................. 713/500 |
| 2014/0133246 | A1 * | 5/2014 | Kumar et al. ............ 365/189.02 |

FOREIGN PATENT DOCUMENTS

| CN | 102214158 A | 10/2011 |
| EP | 0871292 A1 | 10/1998 |

OTHER PUBLICATIONS

International Search Report and Written Opinion—PCT/US2014/018391—ISA/EPO—Jun. 3, 2014.
Sami M., et al., "Reconfigurable architectures for VLSI processing arrays," Proceedings of the IEEE, May 1, 1986, vol. 74 (5), pp. 712-722, XP000756009, ISSN: 0018-9219, Figure 1.

* cited by examiner

*Primary Examiner* — Chirag Shah
*Assistant Examiner* — Rina Pancholi
(74) *Attorney, Agent, or Firm* — Haynes and Boone, LLP

(57) ABSTRACT

An output switch fabric is disclosed that comprises an interleaved plurality of multiplexers for switching channels between first and second busses. The busses run in tracks that form a grid pattern. The interleaving of the multiplexers is arranged according to the grid pattern for the busses.

21 Claims, 12 Drawing Sheets

- PRIOR ART -

FIG. 6

North

| N | S | W | E | c |
|---|---|---|---|---|
| 0 | 0 | 1 | 1 | x |
| 1 | 1 | 0 | 0 | x |
| 2 | 2 | 3 | 3 | x |
| 3 | 3 | 2 | 2 | x |
| 4 | 4 | 5 | 5 | w.4 |
| 5 | 5 | 4 | 4 | w.5 |
| 6 | 6 | 6 | 7 | x |
| 7 | 7 | 7 | 6 | x |
| 8 | 8 | 9 | 9 | x |
| 9 | 9 | 8 | 8 | x |

East

| E | W | N | S | c |
|---|---|---|---|---|
| 0 | 0 | 1 | 1 | x |
| 1 | 1 | 0 | 5 | x |
| 2 | 2 | 3 | 3 | x |
| 3 | 3 | 2 | 2 | x |
| 4 | 4 | 5 | 0 | x |
| 5 | 5 | 9 | 9 | n.4 |
| 6 | 6 | 8 | 8 | n.5 |
| 7 | 7 | 6 | 4 | x |
| 8 | 8 | 4 | 7 | x |
| 9 | 9 | 7 | 6 | x |

South

| S | N | E | W | c |
|---|---|---|---|---|
| 0 | 0 | 1 | 1 | x |
| 1 | 1 | 0 | 0 | x |
| 2 | 2 | 3 | 3 | x |
| 3 | 3 | 2 | 2 | x |
| 4 | 4 | 5 | 5 | e.4 |
| 5 | 5 | 4 | 4 | e.5 |
| 6 | 6 | 6 | 7 | x |
| 7 | 7 | 7 | 6 | x |
| 8 | 8 | 9 | 9 | x |
| 9 | 9 | 8 | 8 | x |

West

| W | E | S | N | c |
|---|---|---|---|---|
| 0 | 0 | 2 | 1 | x |
| 1 | 1 | 6 | 5 | x |
| 2 | 2 | 0 | 3 | x |
| 3 | 3 | 7 | 2 | x |
| 4 | 4 | 3 | 0 | x |
| 5 | 5 | 1 | 6 | s.4 |
| 6 | 6 | 8 | 9 | s.5 |
| 7 | 7 | 4 | 8 | x |
| 8 | 8 | 9 | 4 | x |
| 9 | 9 | 5 | 7 | x |

SWITCHING FABRIC FOR EMBEDDED RECONFIGURABLE COMPUTING

TECHNICAL FIELD

This application relates to reconfigurable computing, and more particularly to a switching fabric for reconfigurable computing.

BACKGROUND

Although processor speeds have been progressively increased, the need for increased computing power remains unabated. For example, smart phones now burden their processors with a bewildering variety of tasks. But a single-core processor can only accommodate so many instructions at a given time. Thus, it is now common to provide multi-core or multi-threaded processors that can process sets of instructions in parallel. But such instruction-based architectures must always battle the limits imposed by die space, power consumption, and complexity with regard to decreasing the instruction processing time.

As compared to the use of a programmable processing core, there are many algorithms that can be more efficiently processed in dedicated hardware. For example, image processing involves substantial parallelism and processing of pixels in groups through a pipeline of processing steps. If the algorithm is then mapped to hardware, the implementation takes advantages of this symmetry and parallelism. But designing dedicated hardware is expensive and also cumbersome in that if the algorithm is modified, the dedicated hardware must be redesigned.

To provide an efficient compromise between instruction-based architectures and dedicated hardware approaches, a reconfigurable instruction cell array (RICA) architecture has been developed. FIG. 1A illustrates an example RICA system 50 having a reconfigurable core 1. In RICA 50, a plurality of instruction cells 2 such as adders (ADD), multipliers (MUL), registers (REG), logic operation shifters (SHIFT), dividers (DIV), data comparators (COMP), logic gates (LOGIC), and logic jump cells (JUMP) are interconnected through a programmable switching fabric 4. The configuration of instruction cells 2 with regard to their logical function or instruction they implement can be reprogrammed every clock cycle as necessary to implement a given algorithm or function. Switching fabric 4 would be reprogrammed accordingly as well. Instruction cells 2 include memory interface cells 12 that interface data for instructions cells 2 as retrieved or loaded into a data memory 8. The resulting processing by instruction cells 2 occurs according to configuration instructions 10 obtained from a configuration RAM 6. A decode module 11 decodes instructions 10 to not only get the configuration data for instructions cells 2 but also for switching fabric 4. RICA 50 interfaces with external systems through I/O ports 16 and specialized instructions cell registers 14. Additional features shown in FIG. 1A are described in U.S. Patent Publication No. 2010/0122105, filed Apr. 28, 2006, the contents of which are hereby incorporated by reference in their entirety.

Note the advantages of a RICA: an algorithm such as image processing that involves processing multiple pixels through a pipelined processing scheme can be mapped to instruction cells in a manner that emulates a dedicated hardware approach. But there is no need to design dedicated hardware, instead one can merely program the cells and switching fabric as necessary. Thus, if an algorithm must be redesigned, there is no need for hardware redesign but instead a user may merely change the programming as necessary. This is quite advantageous over traditional instruction-based computing approaches.

Although a RICA thus offers robust advantages, challenges remain in its implementations. For example, it is conventional to arrange the instruction cells in a reconfigurable array by rows and columns. Each instruction cell, any associated register, and the associated input and output switching fabric for the instruction cell may be considered to reside within a switching box. FIG. 1B shows an example array of switch boxes arranged in rows and columns. A datapath formed between selected switch boxes is carried on selected channels from a plurality of channels. The channels are also arranged in rows and columns matching the rows and columns for the switch boxes. Each channel has a certain width in bits. The row directions may be considered to run east and west whereas the column directions run north and south. A datapath beginning in an instruction cell in an initial switch-box 100 routes from initial switch box 100 on a channel 101 in an east row direction. The routing for the datapath from subsequent switch boxes is in the appropriate east/west row direction or north/south column direction such that a final switch box 105 at some selected row and column position is reached. In this example data path, two instruction cells are configured as arithmetic logic units (ALUs) 110. The instruction cells for the remaining switch boxes are not shown for illustration clarity. Note that each switch box must then accommodate two switching matrices or fabrics: an input switching fabric to select for channel inputs to its instruction cell and also an output switching fabric to select for the channel outputs from the switch box. This disclosure focuses on the output switching fabric.

The number of channels for a RICA is arbitrary—e.g., suppose there are 20 channels, each 8 bits wide. The output switch fabric for any given direction for a switch box could then use 20*8=160 multiplexers to drive the 160 bits in the 20 channels. For example, initial switch box 100 would include 160 multiplexers to drive the 20 channels in east row direction 101 in such an embodiment. An example output switch fabric 150 is shown in FIG. 1C. Switch fabric 150 is configured to switch the channels with regard to north, south, east, and west directions. With regard to each direction, switch fabric 150 receives the channels on input conductors. Similarly, switch fabric 150 drives the channels in each direction on corresponding output conductors. As known in the integrated circuit layout arts, the routing of the channels occurs in tracks in corresponding metal layers. For example, the south input conductors for the channels are arranged in a track 171 that becomes the track for the north output conductors for the channels. Similar tracks cross switch fabric 150 for the north-to-south, east-to-west, and west-to-east routing. The channels are driven out of each side of switch fabric 150 on the output conductors by corresponding multiplexers.

Although a "channel" is a signal that is distinct from the conductors on which it is carried, it is convenient to simply refer to a channel carried on corresponding input conductors as an "input channel." Similarly, a channel carried on corresponding output conductors is an "output channel." For example, a south switching circuit 155 includes the multiplexers to drive the south output channels. Similarly, an east switching circuit 160 includes the multiplexers to drive the east output channels, a west switching circuit 165 includes the multiplexers to drive the west output channels, and a north switching circuit 170 includes the multiplexers to drive the north output channels.

Referring again to FIG. 1B, the output channels for a given switch box's output switch fabric become the input channels for a neighboring switch box's output switch fabric. For example, channel 101 in FIG. 1B is the east output channel for initial switch box 100 whereas channel 101 is the west input channel for neighboring switch box 115.

By grouping all the output multiplexers in corresponding switching circuits, output switching fabric 150 of FIG. 1C suffers from a large degree of bus turning. In that regard, as known in the routing arts, the row and column routing is typically organized in corresponding tracks. With regard to a switching fabric, the track for input conductors in a given direction becomes the track for the output conductors in the opposing direction. Such tracking greatly simplifies the row and column routing. For example, a track 172 for the west input channels spans across the die space for north switching circuit 170 and east switching circuit 160. Track 172 does not run across the die space dedicated to south switching circuit 155. Because channel routing for the north and south directions cannot short to the channel routing for the east the west directions, the row and column routing occurs in dedicated metal layers. For example, a first metal layer (or layers) may be dedicated to the east/west row routing whereas a second metal layer (or layers) would carry the north/south column routing.

The west input channels must thus be "bus turned" in a different metal layer to be received at the multiplexers in south switching circuit 155. The west input channels could not route directly through the first metal layer to couple to south switching circuit 155 since they would then short to the east input channels in their track to south switching circuit 155. Analogous bus turning must occur for the other switching circuits. For example, the south input channels require bus turning to be received at east switching circuit 160. Such bus turning wastes die space, demands excessive power consumption, and leads to timing delays.

The channel switching for switch fabric 150 is conducted with regard to its north, south, west, and east sides of its footprint on its semiconductor substrate surface. With regard to any given footprint side, the corresponding switching circuit can select from the three remaining sides with regard to the input channel selection. For example, the multiplexers in south switching circuit 155 may select from the north input channels, the east input channels, and the west input channels. But south switching circuit 155 cannot select from the south input channels. Similarly, east switching circuit 160 may select from the input channels for the north, south, and west footprint sides. Such a restriction to the three remaining sides for the outputs from any given switch fabric footprint side is conventional in that it leads to considerable routing complexity reduction.

Much study has thus been expended for various switch fabric architectures that follow such a channel selection from the three remaining sides for any given switch fabric side. FIG. 2A shows one type of switch fabric architecture known as a disjoint matrix. In this example, there are five rows and five columns, each numbered from 0 to 4. Each one of rows (or each one of the columns) may be thought of as representing a channel for a given data word. Thus, there are five data channels in this system. For illustration clarity, the input and output channels are not shown separately. Instead, a given channel such as west channel 4 represents both the west input channel 4 and the west output channel 4. In a disjoint matrix, a given channel is restricted to be routed into the same channel. For example, the data word for channel 0 carried on its west input can be switched to propagate in the north output for channel 0 but cannot be switched to propagate in the north output for the remaining channels 1 through 4. Each channel output for a switch fabric side facing a given cardinal direction (north, south, east, or west) can thus be selected by a 3:1 multiplexer (not illustrated) that selects from the remaining sides facing the remaining cardinal directions.

Note the advantage of the disjoint matrix: the 3:1 multiplexer can be located at the intersection of the row and column for a given channel. The inputs to the 3:1 multiplexer are right there at the intersection—there needs to be no bus turning or spanning across other channels to get the inputs. Such a disjoint switching fabric thus greatly simplifies the layout design. But this disjoint simplification comes at a considerable restriction in routing flexibility: a disjoint matrix provides no means for selecting from other channels with regard to any given channel output.

To provide a more flexible routing ability, a universal switch matrix and a Wilton switch matrix have been developed as shown in FIG. 2B and FIG. 2C, respectively. In these switch matrices or fabrics, the selection of the output signals for a channel in a given cardinal direction is not restricted to the same channel. For example, in the universal switch matrix, the output in channel 4 in the north direction can selected from channel 0 west input, channel 4 south input, and channel 4 east input. Similarly, in the Wilton switch matrix, the output in channel 4 north can be selected from the inputs for channel 1 west, channel 0 east, and channel 4 south. But just like the disjoint matrix, each output in a given direction for a universal or Wilton switch matrix may be provided by a 3:1 multiplexer that selects from channel inputs from the remaining directions.

Regardless of the type of matrix, a given channel output in the column dimension is either headed in the north (N) direction or the south direction (S). Similarly, a given channel output in the row dimension is either headed in the west (W) direction or the east (E) direction. The input and output channels follow the same track regardless of the type of switching matrix. For example, the track for input channel 4 becomes the track for the output channel 4 in all the directions. In that regard, it is always the case (regardless of whether the matrix is disjoint, universal, or Wilton) that for a given channel in a given output direction, the same channel can be routed as an input with regard to the opposing cardinal direction. This same-channel-routing occurs for both the columns and the rows. Thus, a north input for a given channel can always be routed in that channel's south output. Conversely, a south input for a given channel can always be routed into that channel's north output. The analogous routing is true for the east and west outputs with regard to the west and east inputs. The possibility of selecting for another channel thus only exists when switching from the row dimension to the column dimension or vice versa. One of the inputs to the 3:1 multiplexing is thus always determined by the channel number and the opposite cardinal direction to the output.

Although universal and Wilton switch matrices have routing flexibility as compared to a disjoint approach, that flexibility comes at the cost of routing complication. For example, the ability to select for channel 0 west input with regard to channel 4 north output in the universal switch matrix example discussed above means that the channel 0 east input to the switching means (such as a 3:1 multiplexer) must span at least the intervening row channels 1, 2, and 3. The wire or lead for such a span must be electrically isolated from the remaining row channel routing as discussed above with regard to bus turning. Thus, the spanning wire such as from channel 0 west input to the multiplexer for the channel 4 north output in the universal matrix must then be routed on a different metal layer from the normal row tracking as coupled to by vias. This bus turning complicates the layout and design considerably.

Accordingly, there is a need in the art for a switching fabric architecture that can provide routing flexibility yet simplify the associated routing complexities.

SUMMARY

A switch fabric is provided that includes a plurality of channel switching circuits for routing into a corresponding plurality of channels. The switch fabric is formed from devices integrated into a semiconductor substrate. The switch fabric thus occupies a footprint on a surface of the semiconductor substrate. With regard to each side of the footprint, the switch fabric receives the plurality of channels on corresponding input conductors and outputs the plurality of channels on corresponding output conductors.

The input and output conductors are arranged in tracks in metal layers adjacent the semiconductor substrate such that the track for a given input conductor becomes the track for the corresponding output conductor. The input conductors and output conductors for a first opposing pair of sides for the footprint are arranged in a plurality of first tracks corresponding to the plurality of channels such that each first track carries the input and output conductors for the corresponding channel.

Each channel switching circuit is configured to route its corresponding channel into the output conductors for each side of the footprint. The channel switching circuits are arranged with respect to the footprint such that each first track spans across the corresponding channel switching circuit with regard to the first opposing pair of sides for the footprint. But the input and output conductors for a second opposing pair of sides for the footprint are arranged in second tracks that span across all the channel switching circuits with regard to the second opposing pair of sides.

Note the advantages of such a switch fabric layout with regard to each channel switching circuit driving its corresponding channel into the corresponding output conductors for the first opposing pair of sides—since the input conductors in the second tracks carry all the channels across each channel switching circuit, a channel switching circuit may readily select from the channels through appropriate vias to the desired channel's input conductors in the second track. No bus turning is thus necessary for such a selection. Moreover, because the channel switching circuits are arranged across the footprint according to the first tracks, there is no wasted die space in the footprint. The resulting switch fabric is thus advantageously dense yet greatly reduces the channel routing complexity.

BRIEF DESCRIPTION OF THE DRAWINGS

FIG. 6 illustrates the channel routing for an example output switch fabric.

Embodiments of the present invention and their advantages are best understood by referring to the detailed description that follows. It should be appreciated that like reference numerals are used to identify like elements illustrated in one or more of the figures.

DETAILED DESCRIPTION

To meet this need in the art, an improved switch fabric architecture is disclosed. This architecture will be described with regard to a RICA but it will be appreciated that it is widely applicable to other systems and circuits that switch channels such as between rows and columns. To eliminate the need for bus turning, the disclosed output switch fabric "brings the multiplexers to the wires" as will be further described herein.

Figure 1A:
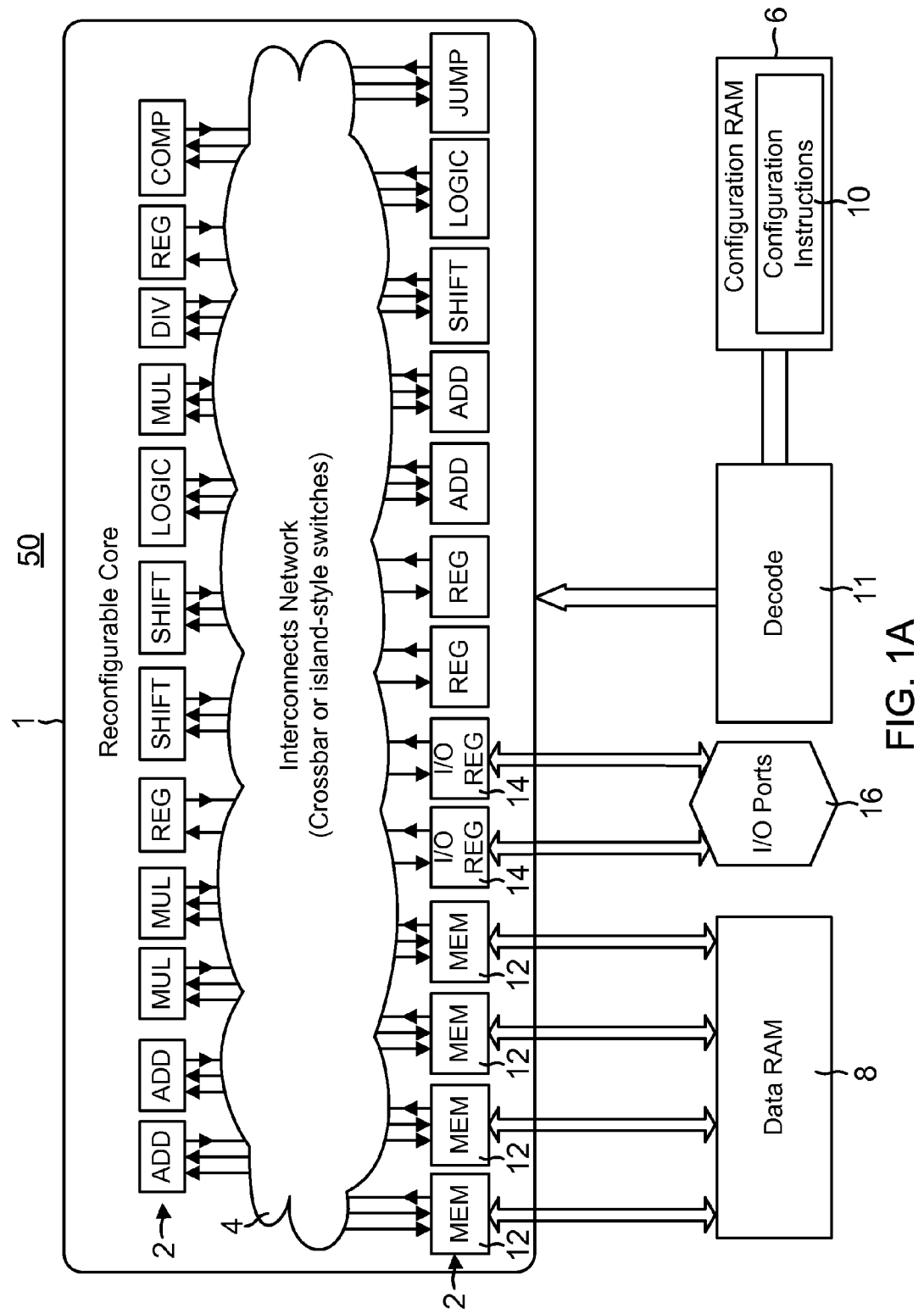
FIG. 1A is a block diagram for an example reconfigurable instruction cell array (RICA).
Figure 1B:
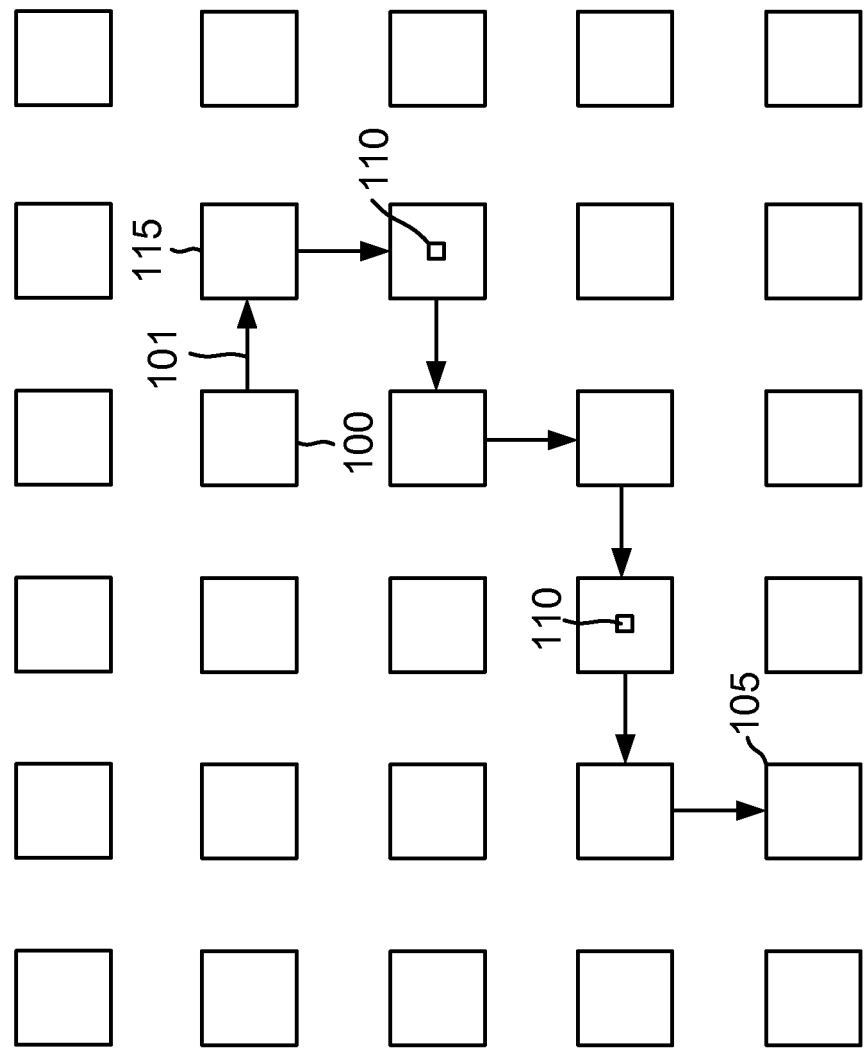
FIG. 1B is a block diagram for an array of switch boxes in the RICA of FIG. 1A.
Figure 1C:
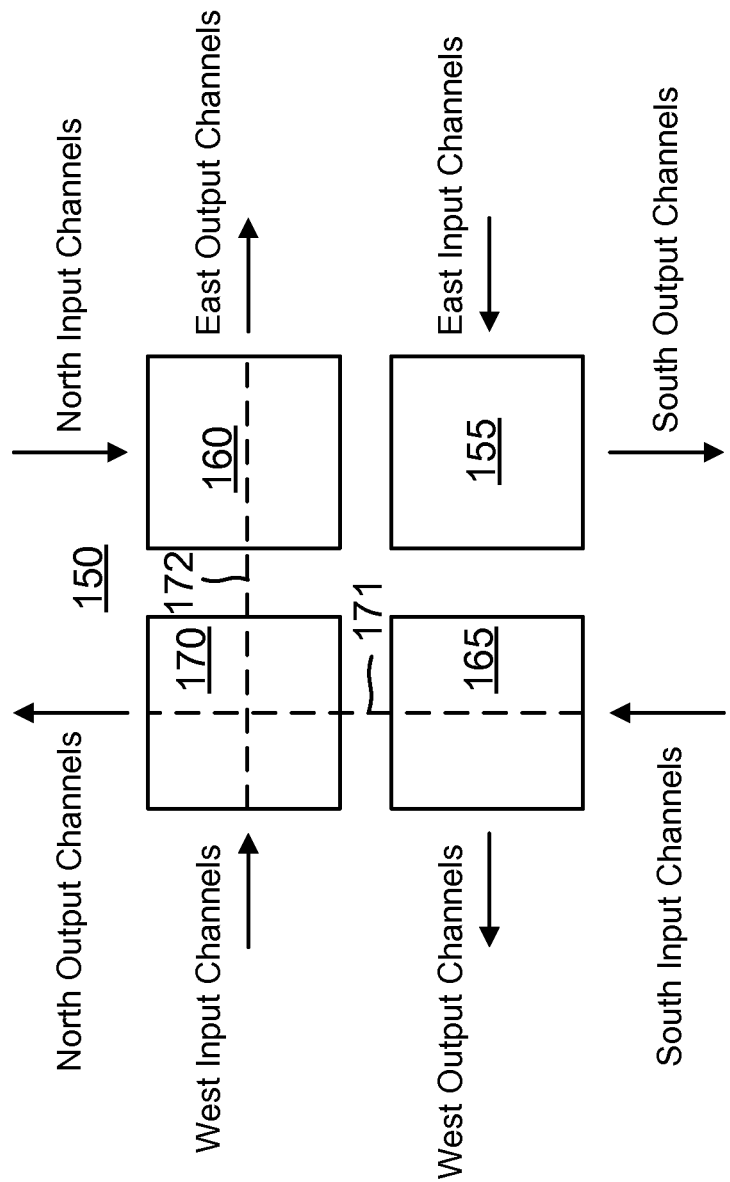
FIG. 1C is a block diagram for an example output switch fabric for a switch box of FIG. 1B.

In contrast, consider again the grouped multiplexers in the switching circuits of FIG. 1C. Because the multiplexers are grouped according to the channel direction they drive, the "wires are brought to the multiplexers." In that regard, each channel will typically have some width in bits although the switching fabric principles disclosed herein include an application to channels that are just one bit wide. Given the channel width, each channel may be routed to the disclosed switching fabric on an input bus comprising corresponding input conductors. The input bus would have the same number of input conductors (which may be denoted as wires) as the channel width in bits. For example, if the channels are eight bits wide, each input bus would include eight input conductors. An analogous output bus comprised of output conductors would be used to conduct each channel from the output switching fabric in the output directions.

The bus turning discussed above for output switching fabric 150 requires the corresponding input bus to span over the input busses for other channels to the multiplexers. For example, should south switching circuit 155 select from a west input channel, the input bus for the selected west input channel must span over the south input channels to the multiplexers in south switching circuit 155. In that sense, the wires for the west input channel are "brought to the multiplexers."

The improved output switch fabrics eliminate the need for such bus turning in that the multiplexers are located corresponding to the bus intersections. In that regard, an input channel bus travels in tracks for the row and column directions. The track for a given input bus becomes the track for the corresponding output bus. To obtain an advantageous density increase and routing complexity reduction, the multiplexers are interleaved rather than grouped. This interleaving will be described with regard to row and column routing for a plurality of channels. In that regard, what is a "row" versus what is a "column" is simply a matter of perspective. Thus, the terms row and column are used herein without loss of generality. The input and output buses for the row directions are arranged in row tracks whereas the input and output buses for the column direction are arranged in column tracks. Whereas the output switch fabric comprises devices integrated into a semiconductor substrate, the input and output busses travel in tracks in corresponding metal layers adjacent an active surface for the semiconductor substrate. The resulting arrangement of tracks with regard to the semiconductor substrate surface is further discussed below with regard to FIG. 7.

Figure 3A:
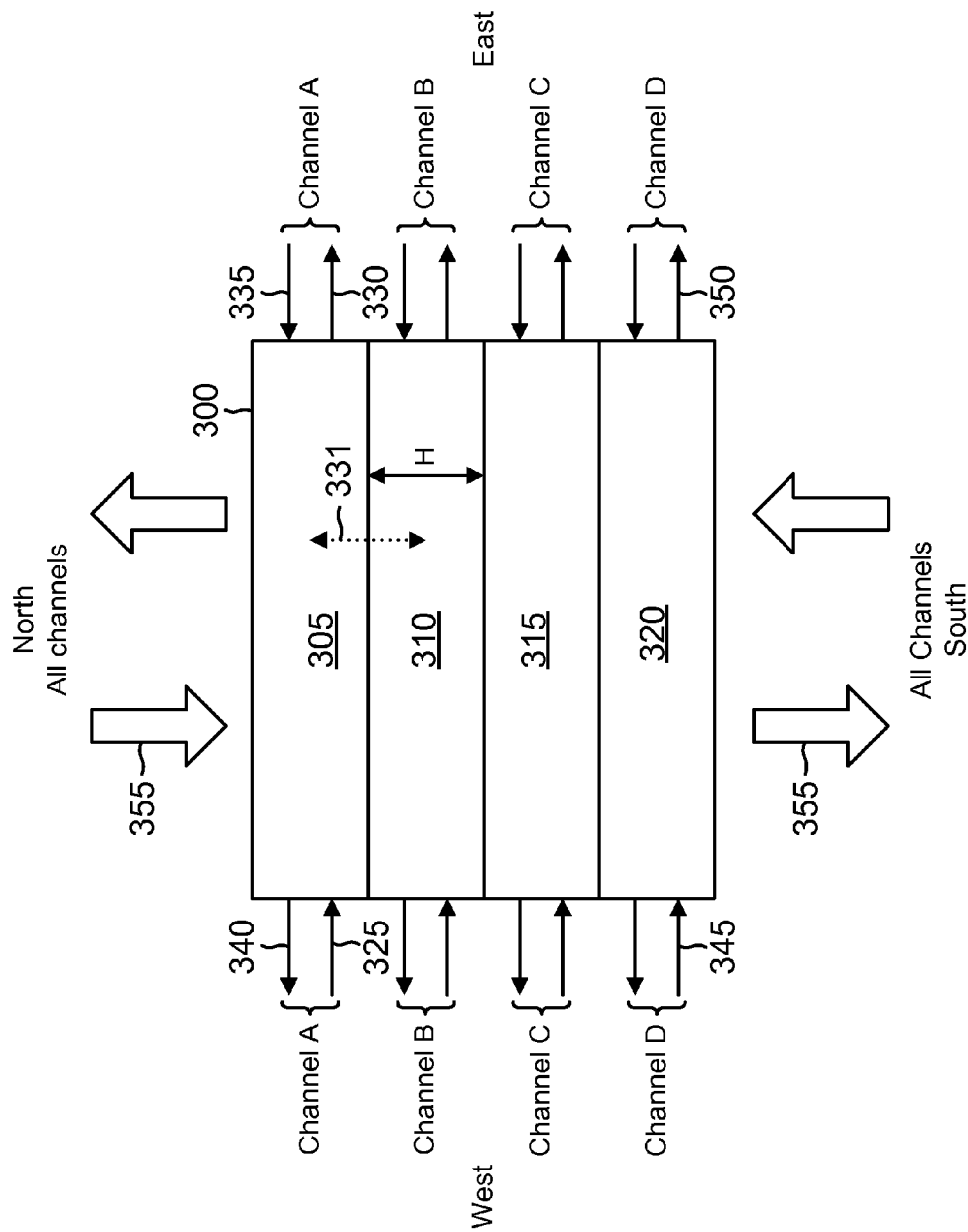
FIG. 3A is a block diagram for an output switch fabric including a plurality of channel switching circuits.

As opposed to grouping all the multiplexers for any given cardinal direction in one location as discussed with regard to switch fabric 150, the advantageous output switch fabrics disclosed herein have interleaved multiplexers. In that regard, it is conceptually illustrative to suppose that one may break up the switching circuits of output switch fabric 150 and interleave the corresponding multiplexers to form an output switch fabric as shown in FIG. 3A. For illustration clarity, the output switch fabric of FIG. 3A is configured to switch with regard to just four channels: A, B, C, and D.

As known in the integrated circuit arts, a given system or component will occupy a certain amount of die space. This die space is the semiconductor surface area occupied by a given circuit and may also be denoted as a footprint. Since the multiplexer interleaving principles herein relate to the physical placement or layout of circuits and corresponding channel routing, the output switch fabric of FIG. 3A is represented by its footprint 300. But since multiplexer interleaving principles disclosed herein also relate to circuit function, footprint 300 will also be referred to as output switch fabric 300. In other words, as disclosed herein, circuits and their footprints will be referred to by the same element number. Each channel has a corresponding switching circuit that drives the output busses for that channel. Thus, a channel A switching circuit 305 is configured to drive the output busses for channel A, a channel B switching circuit 310 is configured to drive the output busses for channel B, and a channel C switching circuit 315 is configured to drive the output busses for channel C. Similarly, a channel D switching circuit 320 is configured to drive the output busses for channel D.

Each channel switching circuit occupies a certain amount of die space. The row and column busses for the channels are routed in tracks in metal layers adjacent to a surface of the semiconductor die. For example, the track for a west input bus 325 for channel A spans across a width of channel A switching circuit 305. The same track eventually becomes the track for an east output bus 330 for channel A. Similarly, an east input bus 335 for channel A spans across channel A switching circuit 305 such that the same track becomes the track for a west output bus 340 for channel A. The remaining row busses are spaced apart such that their tracks span their respective channel switching circuit. For example, the track for a west input bus 345 for channel D spans across channel D switching circuit 320 and becomes the track for an east output bus 350 for channel D. In that regard, each channel switching circuit has a certain height H in the column direction with regard to the die space or footprint it occupies. The tracks for the channels in the row directions are thus spaced apart by at least the channel switching circuit height H.

In contrast to the row channel spacing, the tracks for the column busses are arranged such that each column bus' track spans across all the channel switching circuits. Since each channel switching circuit is thus spanned by all the channels in the column direction, the channel's tracks are not shown separated in the north and south directions. For example, a track 355 symbolizes the tracks for the north input busses for all the channels. Track 355 spans across all the channel switching circuits and exits as track 355 for the south output busses for all the channels. The track for the south input and north output busses span the footprint 300 analogously.

Each channel switching circuit includes the corresponding multiplexers to drive the output busses for the corresponding channel. These multiplexers may be denoted by the cardinal direction they drive. Thus, whereas the south multiplexers in south switching circuit 155 are grouped together, the corresponding south multiplexers driving the south output conductors for switch fabric 300 would be dispersed by channels and placed in the respective channel switching circuit accordingly. The corresponding multiplexers from east switching circuit 160, west switching circuit 165, and north switching circuit 170 would also be dispersed by channels and placed in the respective channel switching circuit accordingly. In this fashion, each channel switching circuit includes an interleaved selection of north, south, east, and west multiplexers to drive the corresponding channel's output busses in the corresponding directions.

It will be appreciated that the designations of directions north, south, east, and west merely refers to the corresponding switch fabric footprint side and is not used to designate directions as defined by a compass. In that regard, footprint 300 may be more generally considered to have four sides. Each side receives input conductors for the channels. The output conductors from the four sides are driven by the corresponding channel switching circuit. For example, channel A switching circuit 305 drives the output conductors for all four sides with its corresponding channel as selected from the input conductors. With regard to a first opposing pair of sides (in this example, east and west), the input and output conductors are arranged by channels in first tracks formed in the appropriate metal layer (or layers). These first tracks span the width of the corresponding channel switching circuit. In contrast, the input and output conductors for a second opposing pair of sides (in this example, north and south) are arranged by bits in second tracks formed in their own appropriate metal layer (or layers). The second tracks span across all the channel switching circuits.

Figure 3B:
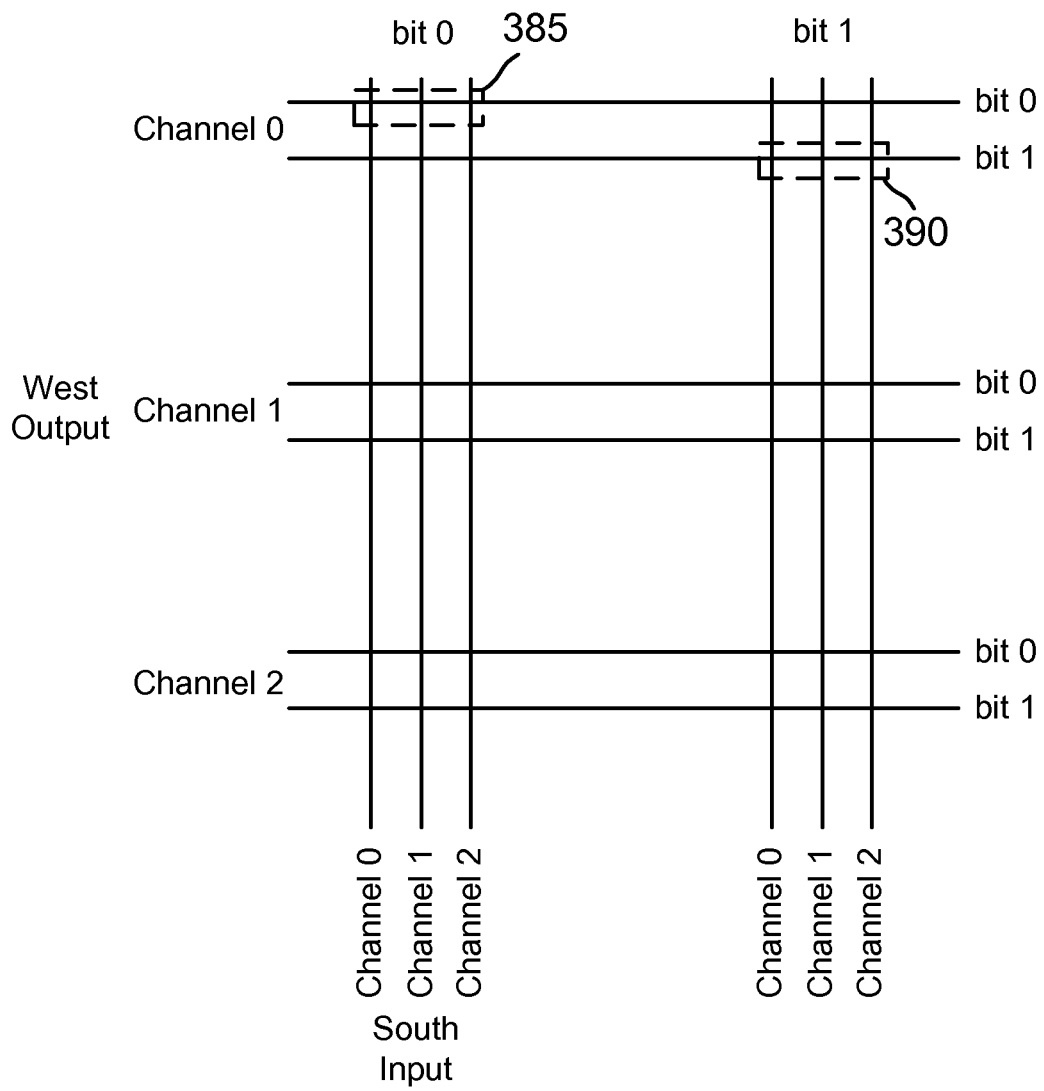
FIG. 3B illustrates the channel track layout for an example output switch fabric.

Note that each channel will typically be wider than just one bit. Each bit for a given channel is carried into the output switching fabric by a corresponding row or column input conductor. Similarly, each bit for a given channel is carried out of the output switching fabric by a corresponding row or column output conductor. For switch matrix 300, the input and output conductors in the column dimension (both north and south) are arranged by bits with regard to any given channel. Conversely, the input and output conductors in the row dimension (east and west) are arranged by channels. For example, suppose there are 3 channels numbered 0 to 2, each channel having a word width of two bits. If the rows are arranged to be consecutive in bits for any given channel and the word width is 2 bits, the resulting row and channel routing is as shown in FIG. 3B. For illustration clarity, FIG. 3B shows only the south input conductors and the west output conductors. The west output conductors form rows whereas the south input conductors form columns. In that regard, what is a "row" versus what is a "column" is simply a matter of perspective such that an assumption that the column and row conductors are arranged in this fashion is not limiting. The point is that one dimension is arranged by channels and the other is arranged by bits.

Figure 3C:
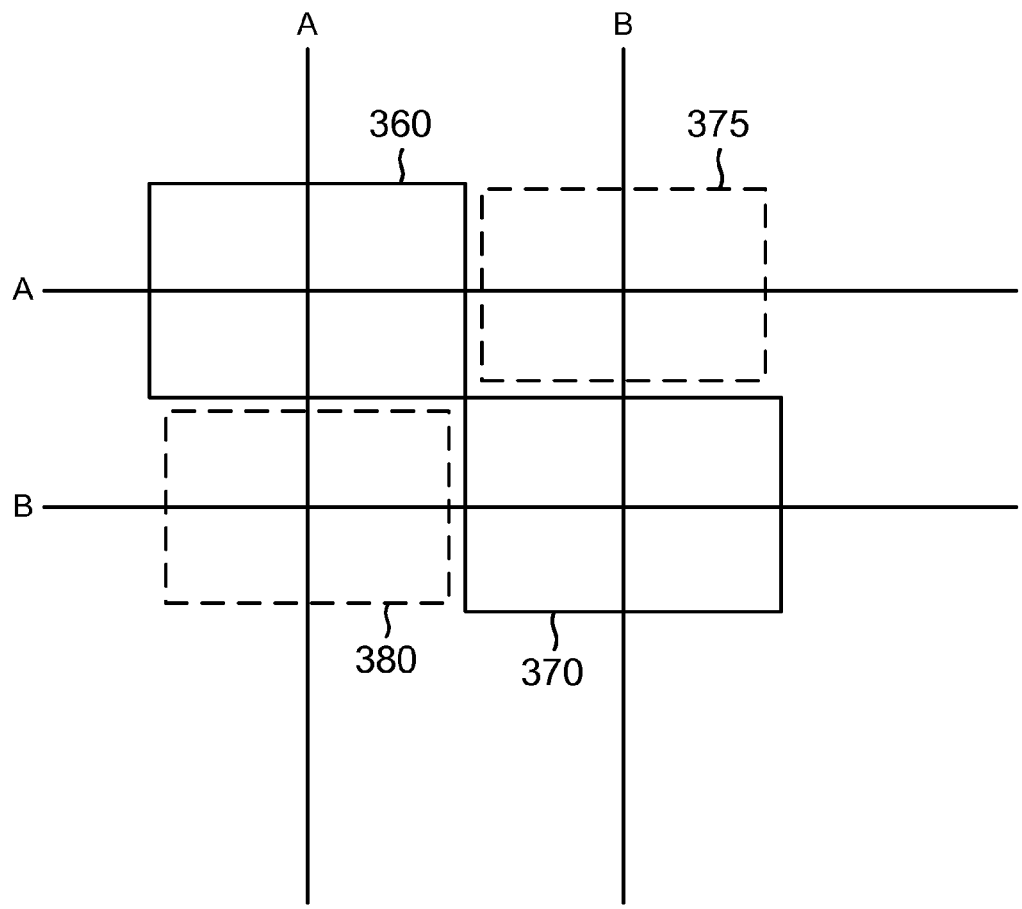
FIG. 3C illustrates the semiconductor substrate footprints occupied by channel switching circuits that are not optimized to achieve density and routing complexity reduction.

In a disjoint switching matrix, the columns and rows need not be arranged in this fashion. But suppose one needs more routing flexibility such as discussed earlier with regard to a universal or a Wilton switching matrix. If the columns are also arranged by channels just as with the rows, the resulting channel switching circuits must be spaced apart accordingly. For example, FIG. 3C shows an example arrangement of channel switching circuits in which the columns and rows are both arranged by channels. For illustration clarity, only two channels are shown in the row and column dimensions: channels A and B. A channel A switching circuit 360 occupies a die space that is spanned by the tracks for channel A in both the column and row dimensions. Similarly, a channel B switching circuit 370 occupies a die space that is spanned by the tracks for channel B in both the column and row dimensions.

But because both the row and columns are arranged by channels, the channel B switching circuit footprint 370 occupies a die space that must be spaced apart in the row dimension with respect to the channel A switching circuit footprint 360 such that die spaces 375 and 380 are empty. Such spacing occurs because a channel switching circuit has no function with regard to driving other channels. Instead, a channel switching circuit can only drive its own channel. Thus, the multiplexers for driving a channel switching circuit's channel are located in the tracks for that channel. The resulting unoccupied die space is of course expensive and diminishes circuit density. In contrast, output switch fabric 300 has no such wasted die space and is thus advantageously dense. Since the channels are arranged by bits in the column direction, the input and output conductors for a given channel span across the width of each channel switching circuit. This results in an advantageous multiplexer tiling or interleaving as will be further discussed herein. In this interleaving, there need be no unused semiconductor area within the switch fabric footprint.

As discussed earlier, FIG. 3B illustrates how the column busses are arranged by bits whereas the row busses are arranged by channels. Routing from the illustrated south input conductors into the west output conductors is thus greatly simplified. For example, a west multiplexer 385 configured to drive bit 0 for west output channel 0 may occupy a die space 385 that is spanned by the track for the south input bit 0 for all three channels. A selected channel (for example channel 2) may thus be readily coupled to west multiplexer 385 merely through a via extending from the input conductor for the south input bit 0 for channel 2 in die space 385. There is thus no complication of channel spanning or bus turning because the wires for the south input channels for bit 0 are all "brought" to west multiplexer 385 in the corresponding track. An analogous west multiplexer 390 for bit 1 occupies die space 390 that is spanned by a bit 1 track for the south input channels. Thus, arranging one of the dimensions by channels and the other by bits as discussed with regard to FIG. 3C reduces routing complexity in non-disjoint routing schemes yet achieves the density discussed with regard to FIG. 3A.

But note that this span reduction only occurs for the column inputs (or whatever dimension is arranged into bits instead of channels). For example, the north multiplexers that drive channel A north output for channel A switching circuit 305 of FIG. 3A are spanned only by the track for the input and output conductors for channel A with regard to the row dimension. Should a datapath routing demand that one of the other channels such as the west input for channel B be routed into channel A north output, then a bus turning is required as represented by arrow 331 extending between the channel A and B row tracks in FIG. 3A. But this bus turning only occurs for the routing of a channel in the row dimension into a different channel in the column dimension. In contrast, no such bus turning is required for the routing of any of the channels in column dimension to any of the channels in the row dimension.

The switching fabric disclosed herein exploits the channel vs. bit routing architecture in one embodiment by limiting, with regard to any routing of east or west input channels into north or south output channels, that the input channel span for the row selection be limited to no more than one channel. In other words, for the routing into a north or south channel i, where i is some arbitrary channel number, the input channel in the row dimension can only be selected from input channel i−1, input channel i, and input channel i+1. The channel span for routing column input channels into row output channels need not be limited to just one channel since that each channel switching circuit is spanned by the tracks for all the column input channels. For example, if the routing architecture of FIG. 3B is expanded to accommodate 10 channels, spanning all 10 channels with regard to the column input channels into any row output channel would still be relatively simple with regard to routing and layout demands.

Thus, in one embodiment, the span for channel selection from the row dimension to the column dimension could be limited to one channel but no limits be imposed with regard to the channel span for channel selection from the column dimension to the row dimension. However, through testing and implementation, it has been shown that such unlimited channel span for the column inputs does not add in a significant fashion to performance. Thus, the span for channel selection from the column dimension to the row dimension for the improved output switch fabric disclosed herein is limited in some embodiments to a value that is less than the channel number. For example, in a 10 channel embodiment, the span limit for channel switching from the column to the row dimension would be five channels.

Figure 4A:
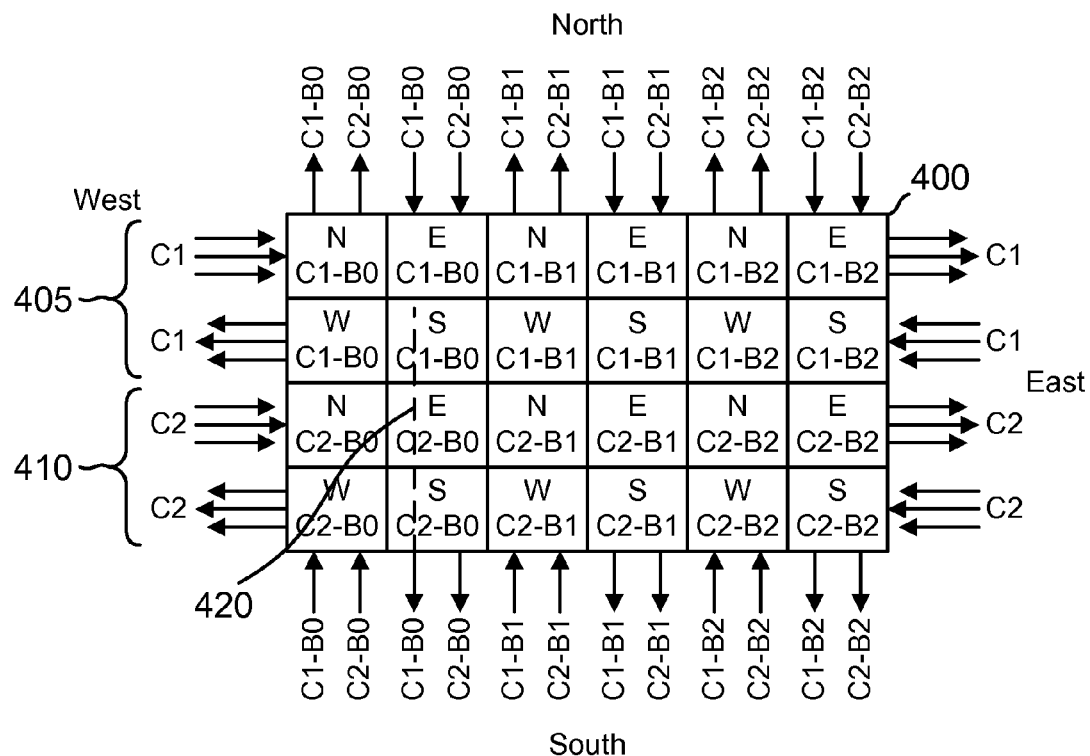
FIG. 4A illustrates an example multiplexer interleaving for an output switch fabric.

Output switch fabric 300 of FIG. 3A is illustrated conceptually in the sense that the interleaved north, south, east, and west multiplexers are not shown within each channel switching circuit. FIG. 4A illustrates an example multiplexer interleaving for an output switch fabric 400. For illustration purposes, output switch fabric 400 is configured to switch only two channels: C1 and C2. Each channel is three bits wide, ranging from a bit B0 to a bit B2. Since each channel is three bits wide, the corresponding channel switching circuits have three north (N) multiplexers, three south (S) multiplexers, three east (E) multiplexers, and three west (W) multiplexers. A C1 channel switching circuit 405 is configured to drive the C1 output busses in the four cardinal directions. Similarly, a C2 channel switching circuit 410 is configured to drive the C2 output busses in the four cardinal directions. The east multiplexers in each channel switching circuit are interleaved with the north multiplexers to form a first row. Similarly, the west multiplexers in each channel switching circuit are interleaved with the south multiplexers to form a second row below the first row. These rows correspond to tracks for the corresponding row busses. The die space for the first row formed by the north and east multiplexers in a given channel switching circuit is spanned by the track for the west input bus and the east output bus for the corresponding channel. For example, the die space occupied by the north and east multiplexers in C1 channel switching circuit 405 are spanned by the track in the corresponding metal layer (or layers) for the C1 west input bus and the C1 east output bus. Since each bus is three bits wide, the track for these busses is such that it accommodates three separate conductors or wires. A similar track spans across the die space occupied by the second row of west and south multiplexers for C1 channel switching circuit 415 to accommodate the conductors for the east input bus and the west output bus for channel C1. The interleaving order for switch fabric 400 may be re-arranged in alternative embodiments.

As used herein, "track" refers to the space in any given metal layer dedicated to a certain set of conductors. For example, a track for the row conductors for a given channel spans the corresponding channel switching circuit. For channel C1 in the row direction, its track spans across channel switching circuit 405. But in reference to a particular row direction such as east input and west output, the overall track for the row conductors for channel C1 is organized into two smaller tracks: a track for the west input and east output conductors, and a track for the east input and west output conductors. But what is common to these tracks is that they define the space in given metal layer (or metal layers) dedicated to a particular set of conductors.

Figure 4B:
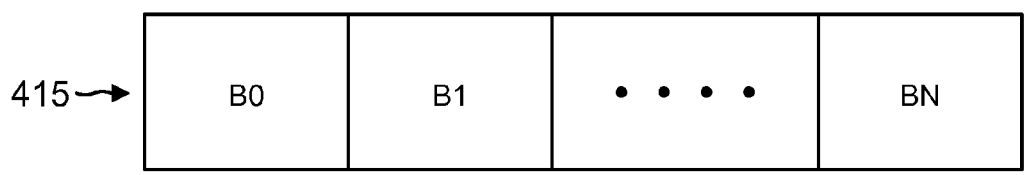
FIG. 4B illustrates the tiling of a channel switch circuit in an output switch fabric.

Regardless of the particular interleaving order, each channel switching circuit may be considered to form a row of tiles such as shown in FIG. 4B for a channel A switching circuit 415. In this embodiment, channel A is N bits wide, ranging from a bit B0 to a bit BN, where N is an arbitrary positive integer. There are thus N tiles corresponding to the N bits. Each tile would include the four multiplexers for the corresponding bit. For example, a first tile B0 would include a north multiplexer to drive a B0 north output conductor for channel A, a south multiplexer to drive a B0 south output conductor for channel A, a west multiplexer to drive a B0 west output conductor for channel A, and an east multiplexer to drive a B0 east output conductor for channel B.

Referring again to switch fabric 400, the resulting tiles are stacked into columns according to the bits. Because there are three bits, each switching fabric includes three tiles of multiplexers. Channel C1 switching circuit 405 includes a tile C1-B0, a tile C1-B1, and a tile C1-B2 corresponding to the 3 bits, respectively. The north, south, east, and west designations for the multiplexers is abbreviated as N, S, E, and W, respectively. For example, a C1-B0 tile for channel C1 switching circuit 405 includes N multiplexer C1-B0, E multiplexer C1-B0, W multiplexer C1-B0, and S multiplexer C1-B0. Similarly, a C2-B0 tile for channel C2 switching circuit 410 includes N multiplexer C2-B0, E multiplexer C2-B-0, W multiplexer C2-B0, and S multiplexer C2-B0. The bit track that accommodates B0 for all the channels passes above the die space for tiles C1-B0 and C2-B0 in the column dimension. Since there are just two channels in this embodiment, there are just two conductors for each bit in the north and south directions. Just like a channel track in the row direction, a bit track in the column direction can actually comprise two individual tracks. For example, a track for bit 0 for the south input and north output for all the channels spans the W and N multiplexers in tiles C1-B0 and C2-B0 within the corresponding metal layer (or layer). This track is sufficiently wide to accommodate the corresponding pair of conductors. A similar track passes over the E and S multiplexers in tiles C1-B0 and C2-B0 to accommodate the north input conductors for bits C1-B0 and C2-B0 and the south output conductors for these same bits. In general, an ith the in each channel switching circuit is spanned by the column tracks for the ith bit, where i represents an arbitrary bit for the channels.

Since each channel switching circuit drives the output conductors for its corresponding channel, the output conductors are defined with regard to each channel switching circuit. For example, an output conductor for C1-B0 south originates in S multiplexer C1-B0 as indicated by dashed line 420.

Referring again to FIG. 1B, each switch box may be considered to have two row sides (east and west) and two column sides (north and south). The resulting array of switch boxes is also arranged by corresponding rows and columns. Each switchbox includes an output switch fabric to route the channels in the row and column directions as discussed herein. In that regard, a switch fabric is configured to route the channels with regard to the four sides of the switch box. Such a routing is equivalent to the routing with regard to the four sides of the output switch fabric's footprint. Since each switch box includes an instruction cell, the output switch fabric for each switch box has two options: it may route an input channel that is driven by some neighboring switch box's output switch fabric or it may route its own instruction cell output signal. Referring again to FIG. 4A, output switch fabric 400 may be implemented within a corresponding switch box of FIG. 1B. Each multiplexer may thus be a 4:1 multiplexer. Three of the inputs are the channel inputs discussed above. The fourth input to each 4:1 multiplexer is the instruction cell output from the corresponding switch box's instruction cell.

To further simplify and optimize the design of the switching fabric, the channels are segmented into a set of registered channels and a set of channels having no storage capability. In one embodiment, the output switching fabric enforces a register-domain separation in that registered channels can only route to other registered channels. Such a register-domain separation increases the routing ability within the respective domains.

Yet another optimization occurs by requiring the switching fabric to ensure channel reachability—in other words, that with a sufficient number of hops from channel to channel, all channels are reachable. Given this requirement of reachability, the switching fabric is optimized to minimize the number of channel hops necessary. In addition, there should be at least one cyclic path per output channel that routes back to the same channel after four hops. It will be appreciated that for a given channel number and word width, a variety of switching fabrics could be implemented to satisfy the 1-channel span for switching from channels in the row dimension into channels in the column dimension, a channel span of less than the total number of channels for switching channels in the column dimension into channels in the row dimension, register-domain separation, minimized hops with reachability, and cyclic path embodiment requirements.

Figure 2C:
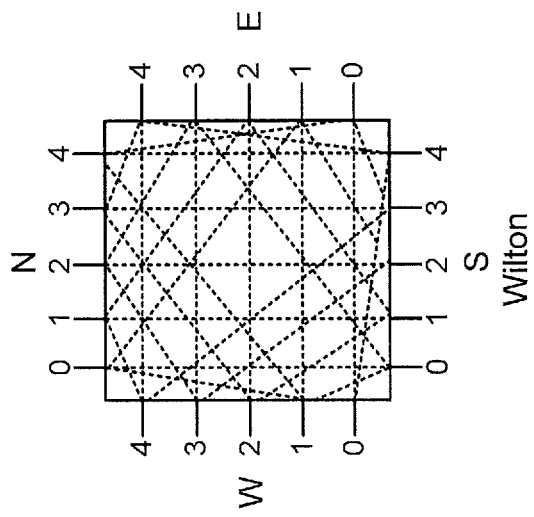
FIG. 2C illustrates the row and column channel routing for a Wilton switch matrix.
Figure 2B:
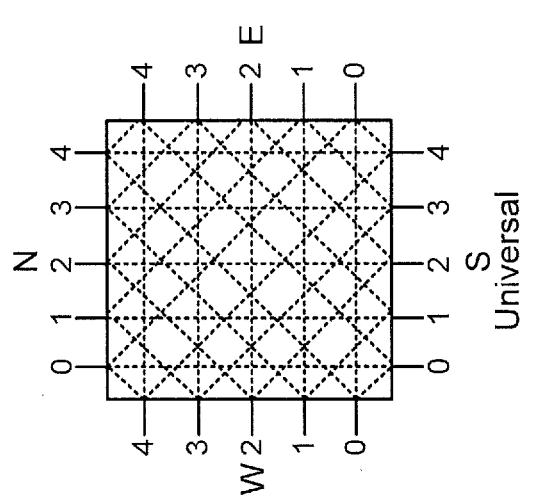
FIG. 2B illustrates the row and column channel routing for a universal switch matrix.
Figure 2A:
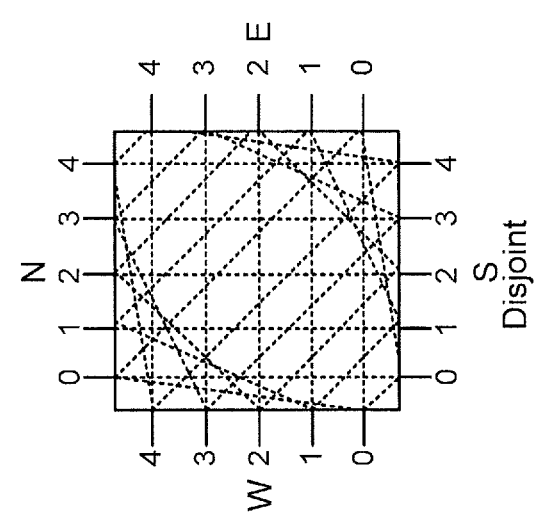
FIG. 2A illustrates the row and column channel routing for a disjoint switch matrix.
Figure 5:
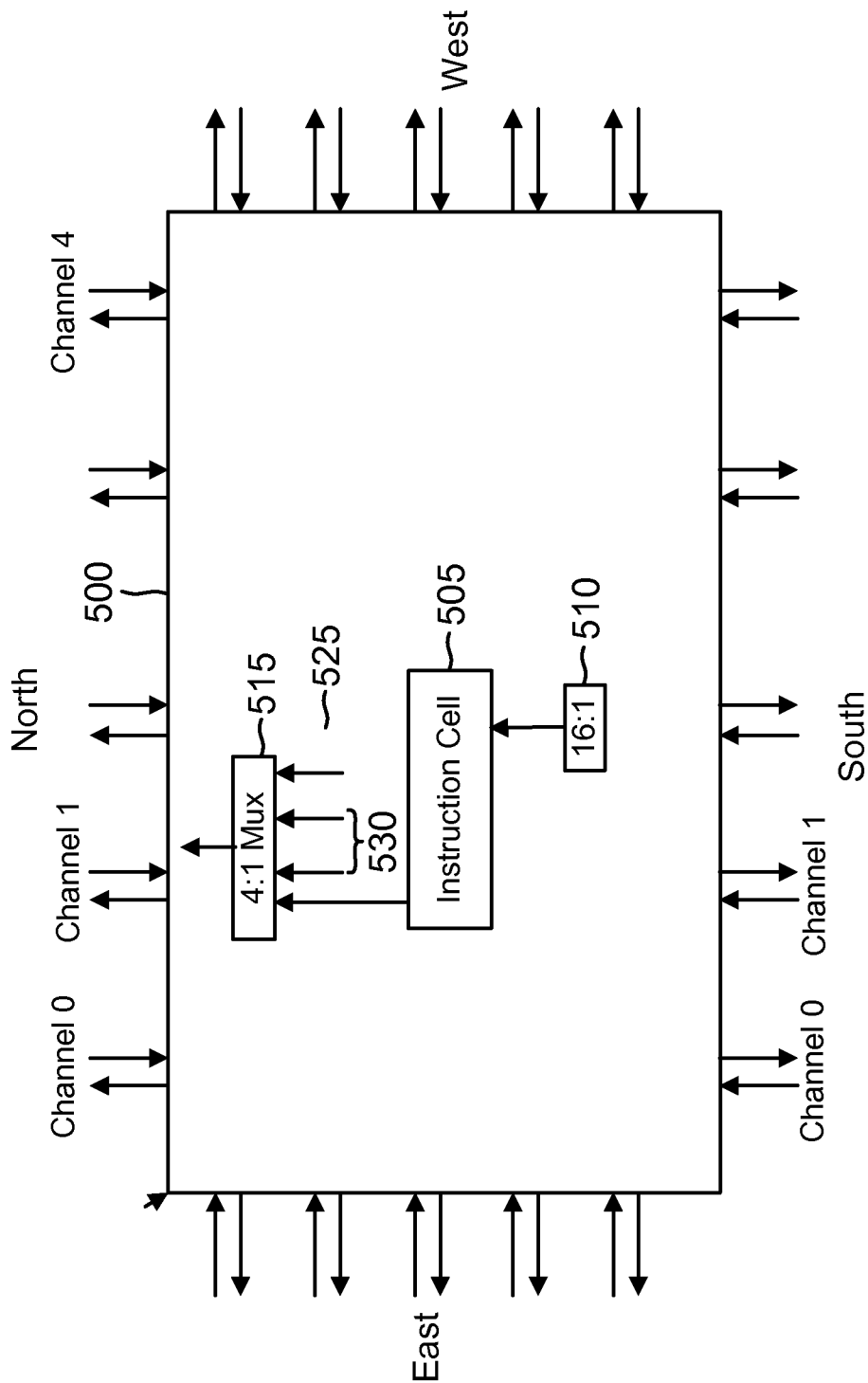
FIG. 5 is a block diagram of an example switch box.

With regard to the channel input selections for any given channel output, a 3:1 multiplexer is sufficient as discussed above. But in a RICA embodiment such as discussed with regard to FIG. 1B, there is also the need to select for the instruction cell output. Thus, each output conductor in a RICA embodiment for each switch fabric footprint side may be driven by a 4:1 multiplexer that selects from the inputs to the 3 remaining footprint sides and an instruction cell output signal. The resulting channel switching for an example switch box (SBOX) 500 having 5 channels per side (the east, west, north, and south directions) is shown in FIG. 5. In this embodiment, each channel is a byte wide (8 bits). Thus, there are 5 channels/side*4 sides (corresponding the east, west, north, and south directions)*1 byte/channel=20 bytes to select from coming into SBOX 500 as well as 20 bytes to select from with respect to propagation from SBOX 500. In this embodiment, an instruction cell 505 associated with switch box 500 processes 4 bytes simultaneously during each clock cycle (its operands thereby being four 8-bit words). Instruction cell 505 is thus shown receiving a 32-bit wide input to produce a 32-bit wide instruction cell output. The selection of this 32-bit wide input is made with regard to channel inputs on all sides of SBOX 500. For example, SBOX 500 may include thirty-two 16:1 multiplexers 510 for this selection. Just as discussed with regard to FIGS. 2A-2C, for a channel output in a given cardinal direction, there is a 3:1 selection with regard to the remaining cardinal directions. One of the three inputs to a given channel output is the same channel in the opposite cardinal direction. But the remaining two channel inputs selected from the orthogonal directions are selected so as to satisfy the goals and rules discussed above. In addition, there is the possibility of a fourth selection in that an instruction cell output from instruction cell 505 may drive a channel output. Thus, the selection for each channel bit output in SBOX 500 may be accomplished by a 4:1 multiplexer 515. Because each channel output word is a byte wide in this embodiment, each channel output word requires eight 4:1 multiplexers 515.

The number of 4:1 multiplexers 515 depends upon the number of channels, the channel width, and the number of words processed by instruction cell 505. In the example shown in FIG. 5, there are five 8-bit output channels per each side of SBOX 500 that may select from four 8-bit words from instruction cell 505 such that there will thus be 8 per byte*4 bytes*5 channels=160 4:1 multiplexers 415 per each cardinal direction (each side of the SBOX 500) for such an embodiment. The output switching fabric that is the focus of this disclosure thus concerns these multiplexers and the span for the channel inputs. Each channel input to 4:1 multiplexer 515 is shown as a 32-bit input to correspond to the 4 bytes provided by instruction cell 405. As discussed previously, one channel input (e.g., a channel input 525) to each multiplexer 515 is determined by the channel output. For example, if multiplexers 515 are selecting for a north output for channel number 1, then channel input 525 would correspond to the south input for channel number 1. More generally, channel input 525 is the input in the same channel as the channel output but from the opposite side or cardinal direction. The remaining two channel inputs 530 to multiplexer 415 come from the orthogonal directions. For example, if multiplexer 515 is selecting for a channel output in the north direction, channel inputs 530 would correspond to east and west channel inputs.

The selection for channel inputs 530 may be implemented so as to satisfy the goals discussed earlier. It will be appreciated that numerous channel mappings or selections satisfy these goals. An example channel mapping for a 10 channel embodiment is shown in FIG. 6. The mappings for the north, east, south, and west channel outputs are shown separately in FIG. 6. For example, the mapping with the heading of "north" lists in the first column the 10 channel outputs in the north direction. As discussed above, an east or west input channel for the north and south output channels can at most span one channel in some embodiments. For example, the north output for channel 7 can select from the east input for channel 6. But the north output for channel 7 cannot be selected from, e.g., the east input for channel 1. The channel number for the south input to any given north output is of course the same as the channel number for that north output.

As compared to the mapping from east and west channel inputs into north and south channel outputs, the channel switching from north and south channel inputs into east and west channel outputs have a greater channel span such as five channels. For example, under the heading of "west" in FIG. 6 are the west outputs for the 10 channels. The west output for channel 1 can be driven by from the south input for channel 6, which demonstrates the five channel span. However, there need not be such a span, it is just a maximum. For example, the west output for channel 8 can be driven by the south input for channel 9, which is just a one channel span.

The columns with a heading of "c" in the FIG. 6 mapping indicate the availability of routing an instruction cell output for a channel output. In general, most of the channel outputs can be selected from the instruction cell output (those channels outputs that can be selected from the instruction cell output are designated by an "x" in corresponding row of the "c" column) But to provide greater routing flexibility, certain channel outputs do not have the ability to select for the instruction cell output but instead can select for an additional channel input. For example, the north output for channel 5 does not have the capability for selecting for the instruction cell output but instead can select for the west input for channel 5.

As discussed previously, the output switching fabric may also accommodate a register domain separation such that the channels are divided into a registered domain and a non-registered domain. Each switch box may thus include a set of registers (not illustrated) for storage of corresponding registered channel outputs. For example, each switch box may include or be associated with registers for the south outputs in channels 1, 2, 4, 6, and 9. Conversely, each switch box would not have registers for registering the remaining south outputs in channels 0 3, 5, 7, and 8 since these remaining south output channels are in the unregistered domain. To increase routeability within the respective domains (registered vs. non-registered), an input from a registered channel can only be mapped to other registered channels.

Figure 7:
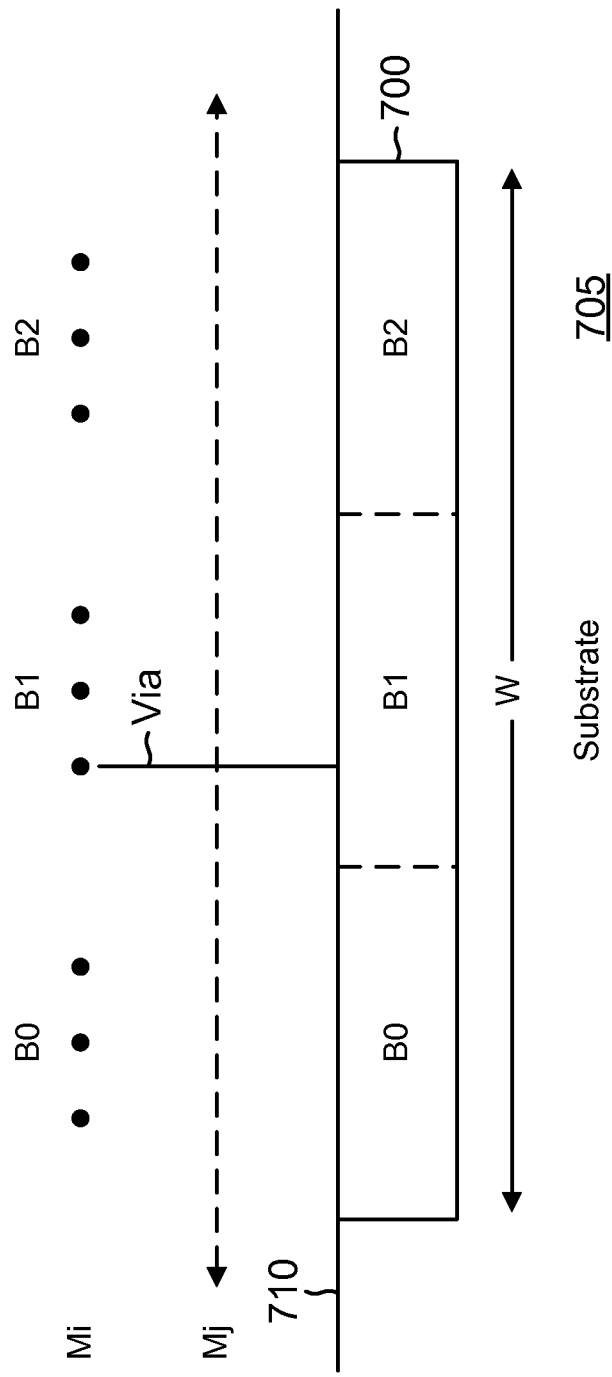
FIG. 7 is a cross-sectional view of a channel switch circuit to show the channel track layout with regard to the semiconductor surface footprint for the channel switch circuit.

As discussed previously, the output switch fabrics disclosed herein "bring the multiplexers to the wires" as opposed to the grouping of the multiplexers for a given switch fabric footprint side and the resulting use of bus turning. To better appreciate this concept, consider the cross-sectional view looking into the column dimension for a channel switching circuit 700 integrated into a semiconductor substrate 705 as shown in FIG. 7. In this embodiment, there are 3 channels, each 3 bits wide ranging from a bit B0 to a bit B2. Channel switching circuit 700 thus includes 3 tiles B0, B1, and B2 corresponding to the bits for its channel. As known in the semiconductor arts, metal layers are separated from an active surface 710 of substrate 705 by intervening insulating layers. The transistors (not illustrated) implementing the various multiplexers in tiles B0, B1, and B2 are integrated into active surface 710. The tracks for the column input and output conductors for each bit span in a metal layer Mi above the corresponding tiles. Since FIG. 7 shows a cross-section along a width W of channel switching circuit 700, each column conductor is seen in cross-section only. In contrast, a row conductor (not illustrated) for the corresponding channel in a metal layer Mj would span the width W for channel switching circuit 700. Since each tile is thus directly traversed by the track for the corresponding bit for all the channels in the column dimension, a row multiplexer (east or west) may be coupled to a column conductor through just a via such as illustrated for tile B1. No bus turning is necessary to accomplish this coupling.

Figure 8:
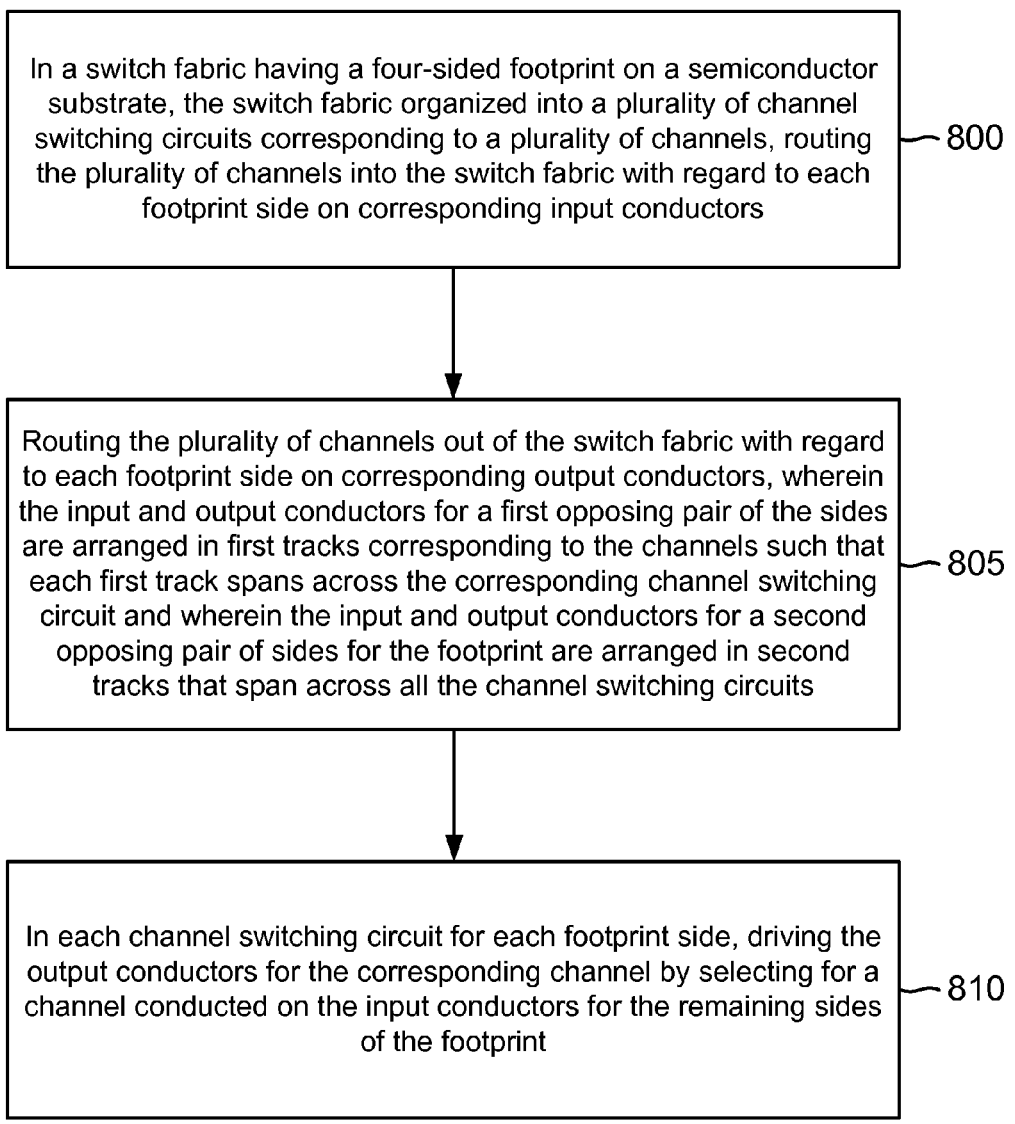
FIG. 8 is a flowchart for an example method of channel routing.

FIG. 8 illustrates a flow chart for a routing method practiced by the improved output switch fabrics disclosed herein. In an initial step 800, a switch fabric having a four-sided footprint on a semiconductor substrate receives a plurality of channels into the switch fabric on corresponding input conductors at each footprint side. The switch fabric is organized into a plurality of channel switching circuits corresponding to the plurality of channels. In a step 805, the switch fabric routes the plurality of channels out of the switching fabric footprint side on corresponding output conductors. With regard to a first opposing pair of sides for the footprint, the input and output conductors are arranged in first tracks corresponding to the channels such the each first track accommodates the input and outputs conductors for the corresponding channel and spans across the corresponding channel switching circuit. With regard to a second opposing pair of sides for the footprint, the input and output conductors for all the channels are arranged in tracks that span across all the channel switching circuits. In a step 810, for each footprint side, each channel switching circuit drives the output conductors for the corresponding channel by selecting for a channel conducted on the input conductors for the remaining sides of the footprint.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A circuit, comprising:
   a switch fabric configured to have a footprint on a semiconductor surface, the footprint having four sides;
   a plurality of input conductors configured to conduct a plurality of channels into the switch fabric with regard to each side of the footprint, each channel having a same width in bits;
   a plurality of output conductors configured to conduct the plurality of channels out of the switch fabric with regard to each side of the footprint, wherein the input and output conductors for a first opposing pair of the sides are arranged in first tracks corresponding to the channels, and wherein the switch fabric includes a plurality of channel switching circuits corresponding to the channels and arranged in the footprint such that each first track spans the corresponding channel switching circuit, and wherein the input and output conductors for a second opposing pair of the sides for the footprint are arranged according to the bits in second tracks such that each second track spans across all the channel switching circuits; and
   wherein each channel switching circuit includes a plurality of multiplexers corresponding to each side, and wherein each side's corresponding multiplexers in each channel switching circuit are configured to drive the output conductors for the channel switching circuit's corresponding channel with a selected channel from the input conductors for the remaining sides.

2. The circuit of claim 1, wherein the multiplexers in each channel switching circuit include first multiplexers configured to drive the corresponding channel into the output conductors for a first side in the first pair of sides, and wherein the multiplexers in each channel switching circuit further include second multiplexers configured to drive the corresponding channel into the output conductors for a remaining second side in the first pair of sides.

3. The circuit of claim 2, wherein each channel switching circuit's first multiplexers and second multiplexers are configured to select from a subset of the plurality of channels from the input conductors, the subset being defined with regard to a channel span from the channel switching circuit's corresponding channel.

4. The circuit of claim 3, wherein the channel span is one-half of a total number of channels in the plurality of channels.

5. The circuit of claim 2, wherein the multiplexers in each channel switching circuit further include third multiplexers configured to drive the corresponding channel into the output conductors for a third side in the second pair of sides, and wherein the multiplexers in each channel switching circuit further include fourth multiplexers configured to drive the corresponding channel into the output conductors for a remaining fourth side in the second pair of sides.

6. The circuit of claim 5, wherein each channel switching circuit, the first, second, third, and fourth multiplexers are arranged in a plurality of tiles corresponding to the plurality of bits, each tile having one each of the first, second, third, and fourth multiplexers.

7. The circuit of claim 6, wherein for each channel switching circuit's tile is configured to drive the corresponding bit for the corresponding channel onto the corresponding output conductor on each side of the footprint.

8. The circuit of claim 6, wherein the tiles are aligned with the second tracks such that each tile aligns with the second track for the corresponding bit.

9. The circuit of claim 5, wherein the third and fourth multiplexers are configured to select from a subset of the plurality of channels from the input conductors, the subset being defined with regard to a channel span of one from the channel switching circuit's corresponding channel.

10. A method, comprising:
    in a switch fabric having a four-sided footprint on a semiconductor substrate, the switch fabric organized into a plurality of channel switching circuits corresponding to a plurality of channels, each channel having the same width in bits, routing the plurality of channels into the switch fabric with regard to each footprint side on corresponding input conductors, the switch fabric having output conductors for the plurality of channels on each footprint side, wherein the input and output conductors for a first opposing pair of the sides are arranged in first tracks corresponding to the channels such that each first track spans across the corresponding channel switching circuit and wherein the input and output conductors for a second opposing pair of sides for the footprint are arranged according to the bits in second tracks that span across all the channel switching circuits; and
    in each channel switching circuit for each footprint side, driving the output conductors for the corresponding channel by selecting for a channel conducted on the input conductors for the remaining sides of the footprint.

11. The method of claim 10, wherein driving the output conductors for each channel switching circuit's corresponding channel comprises using first and second multiplexers with regard to the first opposing pair of sides of the footprint.

12. The method of claim 11, wherein driving the output conductors for each channel switching circuits corresponding channel comprises using third and fourth multiplexers with regard to the second opposing pair of sides of the footprint.

13. A switching fabric configured to switch a plurality of channels with regard to input and output conductors, each channel comprising a digital word, the switching fabric comprising:
    a plurality of first multiplexers configured to select from the input conductors to drive the plurality of channels into output conductors in a first direction;
    a plurality of second multiplexers configured to select from the input conductors to drive the plurality of channels into output conductors in a second direction;
    a plurality of third multiplexers configured to select from the input conductors to drive the plurality of channels into output conductors in a third direction; and
    a plurality of fourth multiplexers configured to select from the input conductors to drive the plurality of channels into output conductors in a fourth direction,
    wherein the first, second, third, and fourth multiplexers are interleaved to form tiles arranged in a plurality of rows, each tile having one first multiplexer, one second multiplexer, one third multiplexer, and one fourth multiplexer, the rows being aligned with the first and second directions and corresponding to the channels such that the output conductors in the first and second directions for each channel are driven by the corresponding row's first and second multiplexers and such that the output conductors in the third and fourth directions are each channel are driven by the corresponding rows third and fourth multiplexers, and wherein the tiles are arranged in a four-sided footprint on a semiconductor substrate, and wherein each digital word has a width in bits and wherein the rows are aligned to form a plurality of columns of the tiles, the columns being parallel with the third and fourth directions, wherein the plurality of columns correspond to the plurality of bits such that, for each column, the column's third and fourth multiplexers are configured to drive the corresponding bit for all the channels in the third and fourth directions into corresponding ones of the output conductors.

14. A circuit, comprising:
a switch fabric configured to route a plurality of channels with regard to four sides of a footprint for the switch fabric on a semiconductor substrate, each channel having same width in bits, wherein for each side of the footprint each bit is carried by a corresponding input conductor into the switch fabric and by a corresponding output conductor out of the switch fabric, and wherein the input and output conductors for a first opposing pair of the four sides are arranged by the channels and wherein the input and output conductors for a remaining opposing pair of the four sides are arranged by the bits; and
the switch fabric including, for each side of footprint, a corresponding plurality of multiplexers configured to drive the side's output conductors with the bits for a selected channel from the input conductors for the remaining sides; wherein the multiplexers for the first opposing pair of the four sides are configured such that a channel span is no greater than one for the channel selection from the input conductors for the remaining opposing pair of the four sides.

15. The circuit of claim 14, wherein the multiplexers for the second opposing pair of the four sides are configured such that a channel span is less than a total number of channels in the plurality of channels for the channel selection from the input conductors for the first opposing pair of the four sides.

16. The circuit of claim 15, further comprising:
a programmable instruction cell providing an output signal, wherein each multiplexer is further configurable to select the output signal for its corresponding output conductor.

17. The circuit of claim 16, wherein each multiplexer is a 4:1 multiplexer.

18. A reconfigurable instruction cell array (RICA), comprising:
a plurality of switchboxes arranged by rows and columns, each switch box including an output switch fabric configured to route a plurality of channels with regard to four sides of the switch box, each channel having a same width in bits, wherein, for each side of the switchbox, each bit for each channel is carried by a corresponding input conductor into the switch box and by a corresponding output conductor out of the switch box, and wherein the input and output conductors for a first opposing pair of the sides are arranged by the channels and wherein the input and output conductors for a remaining opposing pair of the sides are arranged by the bits,
each switch box including a programmable instruction cell operable to provide an output signal responsive to processing of the bits carried by selected ones of the input conductors for the row and column sides, and
wherein the output switch fabric includes a plurality of channel switching circuits corresponding to the plurality of channels, and wherein each channel switching circuit includes a plurality of multiplexers corresponding to each side, and wherein each side's corresponding multiplexers in each channel switching circuit are configured to drive the output conductors for the channel switching circuit's corresponding channel with a selected channel from the input conductors for the remaining sides.

19. The RICA of claim 18, wherein each of the multiplexers comprises a 4:1 multiplexer.

20. The RICA of claim 18, wherein a subset of the switch boxes comprise a registered domain and a remaining portion of the switch boxes comprise an unregistered domain.

21. The RICA of claim 20, wherein the output switch fabrics in the switch boxes in the registered domain are configured to route only within the registered domain.

* * * * *